(12) United States Patent
Okumura et al.

(10) Patent No.: US 7,939,388 B2
(45) Date of Patent: May 10, 2011

(54) PLASMA DOPING METHOD AND PLASMA DOPING APPARATUS

(75) Inventors: Tomohiro Okumura, Osaka (JP); Hisao Nagai, Osaka (JP); Yuichiro Sasaki, Osaka (JP); Katsumi Okashita, Osaka (JP); Hiroyuki Ito, Chiba (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/158,820

(22) PCT Filed: Oct. 4, 2007

(86) PCT No.: PCT/JP2007/069472
§ 371 (c)(1),
(2), (4) Date: Jun. 23, 2008

(87) PCT Pub. No.: WO2008/050596
PCT Pub. Date: May 2, 2008

(65) Prior Publication Data
US 2009/0233385 A1    Sep. 17, 2009

(30) Foreign Application Priority Data
Oct. 25, 2006 (JP) .................................. 2006-290332

(51) Int. Cl.
H01L 21/26 (2006.01)
H01L 21/42 (2006.01)
(52) U.S. Cl. ................ 438/162; 438/513; 257/E21.056; 257/E21.135; 257/E21.248
(58) Field of Classification Search .................. 438/513, 438/162; 257/E21.056, E21.057, E21.135, 257/E21.248
See application file for complete search history.

(56) References Cited

U.S. PATENT DOCUMENTS

| 4,912,065 | A | 3/1990 | Mizuno et al. |
| 2002/0073922 | A1* | 6/2002 | Frankel et al. ................. 118/715 |
| 2004/0147131 | A1* | 7/2004 | Kitsunai et al. ............... 438/710 |
| 2005/0191827 | A1* | 9/2005 | Collins et al. ................. 438/513 |
| 2005/0221020 | A1* | 10/2005 | Fukiage ......................... 427/569 |
| 2006/0019477 | A1* | 1/2006 | Hanawa et al. ............... 438/514 |
| 2006/0107973 | A1* | 5/2006 | Leung ............................. 134/21 |
| 2006/0177996 | A1* | 8/2006 | Koezuka et al. .............. 438/513 |
| 2007/0051470 | A1* | 3/2007 | Iwakoshi et al. ......... 156/345.28 |
| 2007/0176124 | A1* | 8/2007 | Sasaki et al. ............. 250/492.21 |
| 2008/0286982 | A1* | 11/2008 | Li et al. ......................... 438/782 |
| 2009/0280628 | A1* | 11/2009 | Vellaikal et al. .............. 438/513 |

FOREIGN PATENT DOCUMENTS

| JP | 63-14421 | 1/1988 |
| JP | 3-255622 | 11/1991 |
| JP | 6-61161 | 3/1994 |
| JP | 8-31750 | 2/1996 |
| JP | 10-189535 | 7/1998 |
| JP | 2002-170782 | 6/2002 |
| JP | 2002-522899 | 7/2002 |
| JP | 2004-47695 | 2/2004 |
| WO | WO 00/08670 | 2/2000 |

* cited by examiner

*Primary Examiner* — Caridad M Everhart
(74) *Attorney, Agent, or Firm* — McDermott Will & Emery LLP

(57) ABSTRACT

Before a plasma doping process is performed, there is generated a plasma of a gas containing an element belonging to the same group in the periodic table as the primary element of a silicon substrate 9, e.g., a monosilane gas, in a vacuum chamber 1. Thus, the inner wall of the vacuum chamber 1 is covered with a silicon-containing film. Then, a plasma doping process is performed on the silicon substrate 9.

32 Claims, 4 Drawing Sheets

US 7,939,388 B2

PLASMA DOPING METHOD AND PLASMA DOPING APPARATUS

RELATED APPLICATIONS

This application is the U.S. National Phase under 35 U.S.C. §371 of International Application No. PCT/JP2007/069472, filed on Oct. 4, 2007, which in turn claims the benefit of Japanese Application No. 2006-290332, filed on Oct. 25, 2006, the disclosures of which Applications are incorporated by reference herein.

TECHNICAL FIELD

The present invention relates to a plasma doping method for introducing an impurity into the surface of a substrate, and a plasma doping apparatus for performing the method.

BACKGROUND ART

Known techniques for introducing an impurity into the surface of a solid substrate include a plasma doping method of introducing an impurity into the solid substrate with a low energy after ionizing the impurity (see, for example, Patent Document 1). FIG. 6 shows a schematic configuration of a plasma process apparatus for use in a plasma doping method as a conventional impurity introducing method described in Patent Document 1. In a vacuum chamber 101 shown in FIG. 6, a sample stage 106 is provided for receiving a substrate 109 being a silicon substrate. A gas supplying device 102 is attached to a gas exhaust port 126 of the vacuum chamber 101 for supplying a doping material gas containing an intended element, e.g., $B_2H_6$, into the vacuum chamber 101. At an exhaust port 111 of the vacuum chamber 101, a pump 103 is provided for depressurizing the vacuum chamber 101, and it is thereby possible to keep the inside of the vacuum chamber 101 at a predetermined pressure. A quartz plate 122, being a dielectric window of the vacuum chamber 101, is provided with a microwave guide 121 for radiating a microwave into the vacuum chamber 101 through the quartz plate 122. Moreover, an electromagnet 123 is provided so as to surround the vacuum chamber 101. The microwave radiated from the microwave guide 121 and the DC magnetic field formed by the electromagnet 123 interact with each other, thereby forming a magnetic field microwave plasma (electron cyclotron resonance plasma) 124 in the vacuum chamber 101. A high-frequency power supply 110 is connected to the sample stage 106 via a capacitor 125, and it is thereby possible to control the potential of the sample stage 106.

In a plasma process apparatus having such a configuration, the doping material gas introduced in the vacuum chamber 101, e.g., $B_2H_6$, is made into a plasma by plasma generation means including the microwave guide 121 and the electromagnet 123, and boron ions in a plasma 124 produced are introduced into the surface of the substrate 109 by the high-frequency power supply 110.

Specifically, the device production includes, for example, forming a thin oxide film on the surface of a silicon substrate (the substrate 109), and then forming a gate electrode on the substrate 109 by a CVD (chemical vapor deposition) apparatus, or the like. Then, using the gate electrode as a mask, an impurity is introduced into the surface of the substrate 109 by a plasma doping method as described above. After forming source/drain regions, for example, by such an introduction of an impurity, a metal wiring layer, and the like, are formed on the substrate 109, thus obtaining a MOS (metal oxide semiconductor) transistor.

Other than those using an electron cyclotron resonance plasma source as described above, known forms of plasma process apparatuses for use in plasma doping include those using a helicon wave plasma source (see, for example, Patent Document 2), those using an inductively-coupled plasma source (see, for example, Patent Document 3), and those using a parallel plate plasma source (see, for example, Patent Document 4).

Patent Document 1: U.S. Pat. No. 4,912,065
Patent Document 2: Japanese Laid-Open Patent Publication No. 2002-170782
Patent Document 3: Japanese Laid-Open Patent Publication No. 2004-47695
Patent Document 4: Japanese National Phase PCT Laid-Open Publication No.
Patent Document 5: Japanese Laid-Open Patent Publication No. 6-61161

DISCLOSURE OF THE INVENTION

Problems to be Solved by the Invention

However, conventional plasma doping methods and conventional plasma doping apparatuses have a poor reproducibility of the amount of an impurity introduced (dose).

The present inventors conducted various experiments to determine the cause of the problem to discover the following findings. As a plasma doping process is performed by using a boron-containing doping material gas, for example, a thin boron-containing film (thin boron film) deposits on the inner wall of the vacuum chamber. It is believed that as the thickness of the thin boron film deposit increases, the probability for boron radicals to be adsorbed onto the inner wall of the vacuum chamber decreases, thereby increasing the boron radical density in the plasma. Moreover, sputtering occurs as ions in the plasma are accelerated by the potential difference between the plasma and the vacuum chamber inner wall to impinge upon the thin boron film deposited on the inner wall of the vacuum chamber, thereby gradually increasing the amount of particles including boron to be supplied into the plasma. Therefore, over the course of the plasma doping process, the dose gradually increases. The degree of increase is very large, and the dose to be introduced by the plasma doping process immediately after cleaning the inner wall of the vacuum chamber with water and an organic solvent is only about 15% to 30% of the dose to be introduced by the plasma doping process after the plasma doping process is repeated hundreds of times.

As described above, as a result of various experiments, the present inventors discovered that the decrease in the reproducibility of the amount of an impurity introduced (dose) is caused by the variations in the radical density in the plasma.

In view of the above, it is an object of the present invention to provide a plasma doping method and a plasma doping apparatus being capable of controlling the amount of an impurity to be introduced into a substrate surface with a high precision, and having a desirable reproducibility of the dose, i.e., the impurity concentration.

Means for Solving the Problems

In order to achieve the object set forth above, a plasma doping method of the present invention is a plasma doping method in which a substrate is placed in a vacuum chamber to form an impurity-doped layer therein, the method comprising: a step (a) of generating, in the vacuum chamber, a first plasma of a first gas containing an element belonging to the same group in the periodic table as a primary element of the substrate; a step (b), after the step (a), of placing the substrate on a sample stage, which is provided in the vacuum chamber and functions as an electrode; and a step (c), after the step (b), of generating a second plasma of a second gas containing an impurity in the vacuum chamber and supplying a power to the sample stage as the electrode to thereby introduce the impurity into the substrate, thus forming the impurity-doped layer.

The primary element of the substrate herein refers to the substrate constituent element itself excluding the unintentionally-contained substance such as an impurity (i.e., Si for an Si substrate, Ga and As for a GaAs substrate, and Al, Ga and As for an AlGaAs substrate).

In the plasma doping method of the present invention, the step (c) of forming the impurity-doped layer is preceded by the step (a) of generating the first plasma of the first gas containing an element belonging to the same group in the periodic table as the primary element of the substrate in the vacuum chamber. Therefore, a coating (thin film) containing an element belonging to the same group in the periodic table as the primary element of the substrate can be formed in advance on the inner wall of the vacuum chamber. Thus, even if an impurity such as boron is deposited on the inner wall of the vacuum chamber, the deposit on the inner wall can be covered with the coating. Thus, at or near a portion of the inner wall of the vacuum chamber surrounding the sample stage on which the substrate is placed, the probability for impurity-containing radicals to be adsorbed onto the vacuum chamber inner wall surface does not change substantially due to the presence of the coating formed by the gas containing an element belonging to the same group as the primary constituent element of the substrate. There is hardly any sputtering of impurity-containing particles from the vacuum chamber inner wall, whereby it is possible to prevent an impurity from being supplied from the inner wall surface of the vacuum chamber into the substrate. As described above, with the plasma doping method of the present invention, the impurity density in the plasma is kept substantially constant, whereby it is possible to solve the problem that the amount of an impurity to be introduced (dose) varies from one substrate to another, i.e., the problem that the impurity concentration of the impurity-doped layer varies from one substrate to another. Thus, it is possible to realize a plasma doping method with a desirable reproducibility of the concentration of the impurity introduced into the substrate surface. The element contained in the coating formed in the vacuum chamber in step (a), i.e., an element belonging to the same group as the primary constituent element of the substrate, does not serve as an impurity that forms a donor level or an acceptor level with respect to the substrate, whereby it is possible to prevent the substrate from being contaminated with an impurity.

While it is preferred that a high-frequency power is supplied to the electrode serving as a sample stage in the plasma doping method of the present invention, a pulsed power may be supplied alternatively.

In the plasma doping method of the present invention, the step (a) may be a step of depositing a thin film containing an element belonging to the same group in the periodic table as the primary element of the substrate on the inner wall of the vacuum chamber.

In the plasma doping method of the present invention, in order to more reliably prevent the substrate from being contaminated with an impurity, even if an impurity is contained in the first plasma generated in the vacuum chamber in step (a), the amount of the impurity should preferably be so small that the impurity introduced into the substrate in step (c) does not cause an impurity contamination of the substrate, and it is more preferred that no impurity is contained in the first plasma.

In the plasma doping method of the present invention, in the step (a) of generating the first plasma in the vacuum chamber before the step (b) of introducing the substrate into the vacuum chamber, it is preferred that the first gas supplied into the vacuum chamber contains $Si_xH_y$ (x and y are natural numbers), and it is particularly preferred that $Si_xH_y$ is $SiH_4$.

Thus, in a case where the primary constituent element of the substrate is a group IV element, e.g., where the substrate is a silicon substrate, for example, since the first plasma is generated by using the first gas containing an element belonging to the same group in the periodic table as the primary element (i.e., a group IV element), the group IV element contained in the coating formed on the inner wall of the vacuum chamber does not serve as an impurity that forms a donor level or an acceptor level with respect to the substrate such as a silicon substrate. Therefore, it is possible to prevent the substrate from being contaminated with an impurity. Thus, it is possible to relatively easily realize a plasma doping method with a desirable reproducibility of the concentration of the impurity introduced into the substrate surface.

In a case where the first gas contains $Si_xH_y$, it is more preferred that the first gas supplied into the vacuum chamber contains $H_2$. Thus, when forming a deposit (thin film) on the vacuum chamber inner wall by generating a first plasma of a first gas containing an element belonging to the same group in the periodic table as the primary element of the substrate, i.e., Si, in step (a), it is possible to prevent the generation of a dangling bond. Therefore, it is possible to realize a stable surface condition in the thin film formed on the inner wall. Thus, it is possible to provide a plasma doping method with a more desirable reproducibility of the concentration of the impurity introduced into the substrate surface.

In a case where the first gas contains $Si_xH_y$, the first gas supplied into the vacuum chamber may contain $O_2$. Then, it is possible to form a thin film of a chemically stable oxide, as the thin film formed on the inner wall. Therefore, it is possible to suppress the sputtering of the thin film. Thus, it is possible to relatively easily realize a plasma doping method with a more desirable reproducibility of the concentration of the impurity introduced into the substrate surface.

In the plasma doping method of the present invention, in the step (a) of generating the first plasma in the vacuum chamber with no substrate being placed on the sample stage in the vacuum chamber, the first gas supplied into the vacuum chamber may contain an organic silane. Then, it is possible to improve the level of safety as compared with a case where the first gas contains toxic $Si_xH_y$.

In a case where the first gas contains an organic silane, it is preferred that the organic silane is TEOS (tetraethylorthosilicate). Then, it is possible to relatively easily realize a plasma doping method with a desirable reproducibility of the concentration of the impurity introduced into the substrate surface.

In a case where the first gas contains an organic silane, it is preferred that the first gas supplied into the vacuum chamber contains $O_2$. Then, it is possible to form a thin film of a chemically stable oxide, as the thin film formed on the inner wall. Therefore, it is possible to suppress the sputtering of the thin film. Thus, it is possible to realize a plasma doping method with a more desirable reproducibility of the concentration of the impurity introduced into the substrate surface.

In the plasma doping method of the present invention, it is preferred that the impurity introduced into the impurity-doped layer in the step (c) is B (boron) or P (phosphorus).

Then, it is possible to form a p-type or n-type silicon layer in the production of an Si-based semiconductor device.

In the plasma doping method of the present invention, in the step (a) of generating the first plasma in the vacuum chamber with no substrate being placed on the sample stage in the vacuum chamber, it is preferred that a dummy material is placed on the sample stage in the vacuum chamber. Then, it is possible to prevent the sample stage from being damaged by the plasma, and it is possible to realize a more stable plasma doping process.

In the plasma doping method of the present invention, it is preferred that the method further includes, before the step (a), a step (d) of generating a third plasma of a third gas containing F (fluorine) in the vacuum chamber. Then, even if an impurity such as boron is deposited on the inner wall of the vacuum chamber before step (a), the deposit can be removed. Therefore, it is possible to realize a plasma doping method with a more desirable reproducibility of the concentration of the impurity introduced into the substrate surface.

In a case where the method includes the step (d) of generating the third plasma of an F-containing third gas, it is more preferred that the third gas contains $S_xF_y$ or $C_xF_y$ (x and y are natural numbers). In a case where the third gas contains $S_xF_y$, even an organic substance such as a resist can be removed from the inner wall of the vacuum chamber through etching with the third plasma of the third gas, whereby it is possible to bring the vacuum chamber inner wall to a clean condition with a good reproducibility. In a case where the third gas contains $C_xF_y$, there is obtained a similar effect to that in a case where the third gas contains $S_xF_y$, though a carbon-containing product may slightly deposit on the vacuum chamber inner wall. In a case where the third gas contains $C_xF_y$, it is possible to remove the carbon-containing product by performing etching with an oxygen plasma in the vacuum chamber after the $C_xF_y$ process, i.e., by performing two-step etching. Alternatively, the vacuum chamber inner wall may be cleaned with a third plasma of a third gas containing $O_2$ in addition to $C_xF_y$, so that substantially no carbon-containing product deposits thereon. Thus, if the third gas contains $S_xF_y$ or $C_xF_y$ (x and y are natural numbers), the vacuum chamber inner wall can be brought to a clean condition before the step (a), whereby it is possible to relatively easily realize a plasma doping method with a desirable reproducibility of the concentration of the impurity introduced into the substrate.

In a case where the method includes the step (d) of generating the third plasma of an F-containing third gas, it is more preferred that in the step (d), a substance deposited on the inner wall of the vacuum chamber, e.g., a boron-containing film or a silicon-containing film, is removed, while supplying an F-containing third gas from a gas supplying device into the vacuum chamber with no substrate being placed on the sample stage in the vacuum chamber and while exhausting the vacuum chamber to thereby control the pressure inside the vacuum chamber at a predetermined pressure. Then, it is possible to realize a plasma doping method with a more desirable reproducibility of the concentration of the impurity introduced into the substrate surface.

In a case where the method includes the step (d) of generating the third plasma of an F-containing third gas, it is more preferred that in the step (d), a dummy material is placed on the sample stage, while supplying an F-containing third gas from a gas supplying device into the vacuum chamber with no substrate being placed on the sample stage in the vacuum chamber and while exhausting the vacuum chamber to thereby control the pressure inside the vacuum chamber at a predetermined pressure. Then, it is possible to prevent the sample stage from being damaged by the plasma, and it is possible to realize a more stable plasma doping process.

In a case where the method includes the step (d) of generating the third plasma of an F-containing third gas, it is more preferred that in the step (d), a change in the light emission intensity of the third plasma or a change in the high-frequency impedance in the vacuum chamber is monitored to thereby detect the end point at which to end the step (d), while supplying an F-containing third gas from a gas supplying device into the vacuum chamber with no substrate being placed on the sample stage in the vacuum chamber and while exhausting the vacuum chamber to thereby control the pressure inside the vacuum chamber at a predetermined pressure. Then, it is possible to prevent the vacuum chamber inner wall, or the like, from being damaged by the plasma, and it is possible to realize a more stable plasma doping process.

In the plasma doping method of the present invention, the step (a) may be performed once for one iteration of the step (b) and the step (c). Then, a first gas containing an element belonging to the same group in the periodic table as the primary element of the substrate is supplied in the step (a) for every substrate, whereby it is possible to realize a very stable and very precise impurity concentration control.

In a case where the method includes the step (d) of generating the third plasma of an F-containing third gas in the plasma doping method of the present invention, the step (d) may be performed once for a plurality of iterations of the step (b) and the step (c). Then, although a cleaning process is performed once for a plurality of iterations of impurity introduction, it is still possible to increase the precision of the impurity concentration control, and it is therefore possible to realize a high-precision impurity concentration control while improving the productivity.

In a case where the method includes the step (d) of generating the third plasma of an F-containing third gas in the plasma doping method of the present invention, the step (a) may be performed less frequently than the step (b) and the step (c), and the step (d) may be performed less frequently than the step (a). Then, the frequency of cleaning and the frequency of supplying a first gas containing an element belonging to the same group in the periodic table as the primary element of the substrate are both smaller than the frequency of impurity introduction, whereby it is possible to realize a high-precision impurity concentration control while improving the productivity.

A plasma doping apparatus of the present invention is a plasma doping apparatus a vacuum chamber, a sample stage provided in the vacuum chamber and functioning as an electrode, a gas supplying device for supplying a gas into the vacuum chamber, an exhauster for exhausting the vacuum chamber, a pressure controlling device for controlling a pressure inside the vacuum chamber, and a power supply for generating a plasma, wherein the gas supplying device includes a deposition gas supplying system for supplying a deposition gas.

With the plasma doping apparatus of the present invention, a deposition gas such as a gas containing Si and H is supplied into the vacuum chamber to thereby form a coating on the vacuum chamber inner wall prior to the plasma doping process, whereby it is possible to realize a plasma doping apparatus with a desirable reproducibility of the concentration of the impurity introduced into the substrate surface, as described above with respect to the plasma doping method of the present invention. In the plasma doping apparatus of the present invention, the deposition gas supplying system may be any system capable of supplying a gas containing an element belonging to the same group in the periodic table as the primary element of the substrate into the vacuum chamber for generating a plasma.

It is preferred that the plasma doping apparatus of the present invention further includes an end point detecting device for monitoring a change in the light emission intensity of the plasma or a change in the high-frequency impedance in the vacuum chamber. Then, it is possible to prevent the vacuum chamber inner wall, or the like, from being damaged by the plasma, and it is possible to realize a more stable plasma doping process. The change in the high-frequency impedance can be detected, for example, by using a high-frequency matcher attached to the high-frequency power supply being the power supply for supplying a power to the sample stage.

In the plasma doping apparatus of the present invention, it is preferred that the gas supplying device further includes a fluorine-containing gas supplying system for supplying a fluorine-containing gas. Then, even if an impurity such as boron is deposited on the inner wall of the vacuum chamber before the plasma doping process, the deposit can be removed, whereby it is possible to realize a plasma doping method with a more desirable reproducibility of the concentration of the impurity introduced into the substrate surface.

Effects of the Invention

According to the present invention, the impurity density in a plasma can be kept substantially constant, and it is therefore possible to prevent the amount of an impurity to be introduced (dose) from varying from one substrate to another, i.e., prevent the impurity concentration of the impurity-doped layer from varying from one substrate to another. Thus, it is possible to realize plasma doping with a desirable reproducibility of the concentration of the impurity introduced into the substrate surface.

DESCRIPTION OF REFERENCE NUMERALS

Figure 1:
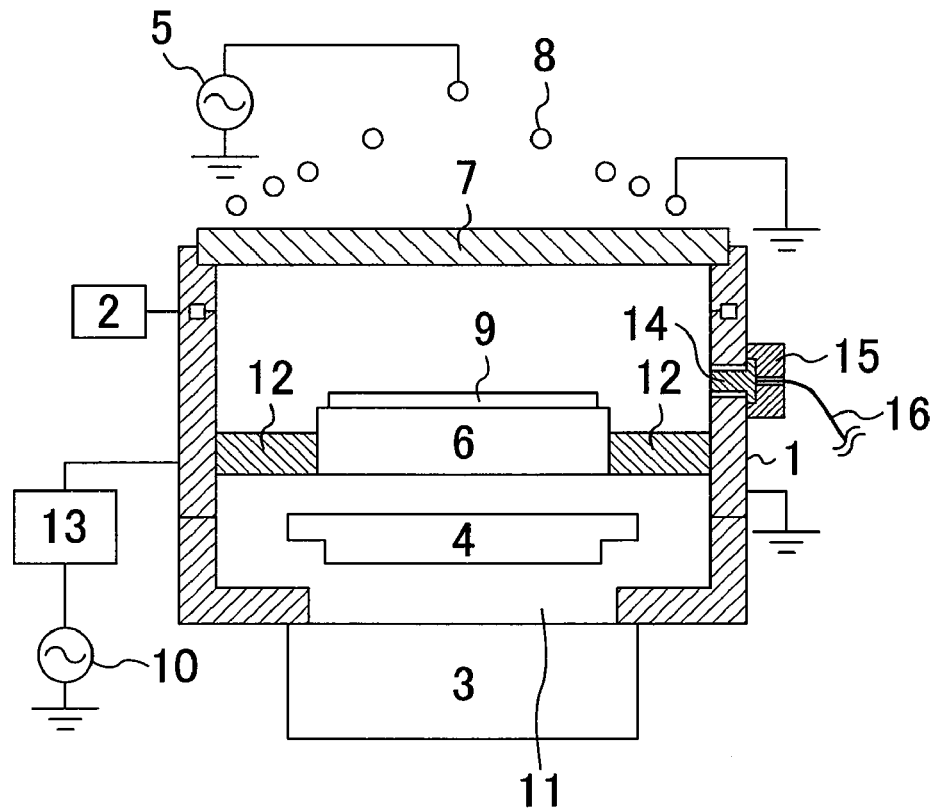
FIG. 1 is a cross-sectional view showing a configuration of a plasma doping apparatus for use in a plasma doping method in one embodiment of the present invention.

1 Vacuum chamber
2 Gas supplying device
3 Turbomolecular pump
4 Pressure controlling valve
5 High-frequency power supply
6 Sample stage
7 Dielectric window
8 Coil
9 Silicon substrate
10 High-frequency power supply
11 Exhaust port
12 Post
13 Matcher
14 Window
15 Window cover
16 Optical fiber

BEST MODE FOR CARRYING OUT THE INVENTION

Embodiment

A plasma doping method and a plasma doping apparatus in one embodiment of the present invention will now be described with reference to the drawings.

FIG. 1 is a cross-sectional view showing a plasma doping apparatus used in the plasma doping method in one embodiment of the present invention. The plasma doping apparatus shown in FIG. 1 includes a vacuum chamber 1, a sample stage 6 provided in the vacuum chamber 1 and functioning as an electrode, a gas supplying device 2 for supplying a gas into the vacuum chamber 1, a turbomolecular pump 3 as an exhauster for exhausting the vacuum chamber 1, a pressure controlling valve 4 as a pressure controlling device for controlling the pressure inside the vacuum chamber 1, and a high-frequency power supply 5 provided outside the vacuum chamber 1 for generating a plasma.

The sample stage 6 is fixed to the vacuum chamber 1 by four posts 12, which are connected to the inner side wall of the vacuum chamber 1, for example. A silicon substrate 9 as a substrate, for example, is placed on the sample stage 6. For example, the gas supplying device 2 includes a system for supplying an Si and H-containing deposition gas, a system for supplying an impurity-containing gas, and a system for supplying an F (fluorine)-containing gas. The turbomolecular pump 3 is attached to an exhaust port 11 provided on the bottom of the vacuum chamber 1 located directly below the sample stage 6, for example. The pressure controlling valve 4 is an elevating valve located directly below the sample stage 6 and directly above the turbomolecular pump 3, for example.

A dielectric window 7 facing the sample stage 6 is provided in a ceiling portion of the vacuum chamber 1. A coil 8 to which a high-frequency power from the high-frequency power supply 5 is supplied is provided in the vicinity of the dielectric window 7 outside the vacuum chamber 1.

A high-frequency power supply 10 for supplying a high-frequency power to the sample stage 6 is provided outside the vacuum chamber 1. The high-frequency power supply 10 is configured so as to supply a voltage to the sample stage 6 via a matcher 13.

A window 14 is provided in a side wall portion of the vacuum chamber 1, and an optical fiber 16 is extended out through the window 14. It is preferred that the window 14 is positioned at substantially the same height as, or slightly above, the substrate placed on the sample stage 6. A window cover 15 is attached to the window 14 for preventing light other than the plasma emission from entering the optical fiber 16.

In the plasma doping apparatus shown in FIG. 1, a predetermined gas is introduced into the vacuum chamber 1 from the gas supplying device 2 while the gas is discharged through the exhaust port 11 by the turbomolecular pump 3 as an exhauster. The inside of the vacuum chamber 1 can be kept at a predetermined pressure by the pressure controlling valve 4. An inductively-coupled plasma can be generated in the vacuum chamber 1 by supplying from the high-frequency power supply 5 a high-frequency power of 13.56 MHz, for example, to the coil 8 provided in the vicinity of the dielectric window 7 facing the sample stage 6. Then, the potential of the sample stage 6 is controlled by the high-frequency power supply 10 so that the silicon substrate 9 as a substrate placed on the sample stage 6 has a negative potential with respect to the plasma.

Thus, as ions in the plasma are accelerated toward the surface of the silicon substrate 9 to impinge upon the surface, it is possible to make the surface of the silicon substrate 9 amorphous or to introduce an impurity into the silicon substrate 9.

Figure 2:
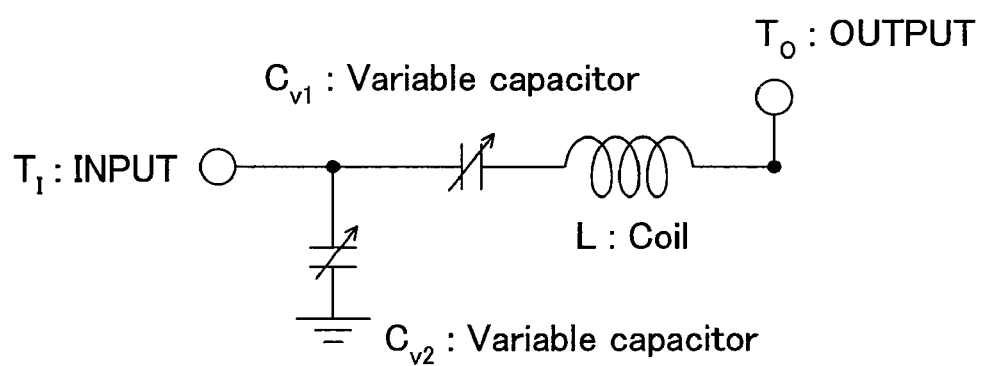
FIG. 2 is an equivalent circuit diagram of a matcher of the plasma doping apparatus shown in FIG. 1.

FIG. 2 shows an exemplary equivalent circuit of the matcher 13 provided between the high-frequency power supply 10 and the sample stage 6. In the matcher 13 shown in FIG. 2, a first variable capacitor $C_{V1}$ and a coil L are connected in series between an input terminal $T_I$ and an output terminal $T_O$. Moreover, one terminal of a second variable capacitor $C_{V2}$ is connected between the input terminal $T_I$ and the first variable capacitor $C_{V1}$, and the other terminal of the second variable capacitor $C_{V2}$ is grounded. The input terminal $T_I$ is connected to the high-frequency power supply 10, and the output terminal $T_O$ is connected to the sample stage 6. While the matcher 13 is normally used for matching the output of the high-frequency power supply 10, it is also possible by using the matcher 13 to detect the change in the capacitance, i.e., the change in the high-frequency impedance, due to the deposit on the inner wall of the vacuum chamber 1, thereby detecting the end point of the cleaning process to be described below or detecting the deposit film thickness in the pre-deposition process to be described below.

Moreover, in the plasma doping apparatus shown in FIG. 1, the plasma emission in the vacuum chamber 1 can be detected by a spectroscope (not shown) or a photodiode (not shown), or the like, provided outside the vacuum chamber 1 through the optical fiber 16 extended out through the window 14 provided in the inner wall of the vacuum chamber 1. Also by detecting the intensity of the plasma emission using the optical fiber 16, it is possible to detect the end point of the cleaning process to be described below or detecting the deposit film thickness in the pre-deposition process to be described below.

The plasma doping apparatus shown in FIG. 1 employs both of a device for detecting the end point by detecting the change in the capacitance (the change in the high-frequency impedance) using the matcher 13 and a device for detecting the end point by optically detecting the plasma emission using the optical fiber 16. However, the apparatus may employ only one of the end point detecting devices. Alternatively, the cleaning process and the pre-deposition process, and the like, to be described below may be performed successively based on a prescribed amount of time obtained in advance based on a measurement, without using these end point detecting functions.

Figure 3:
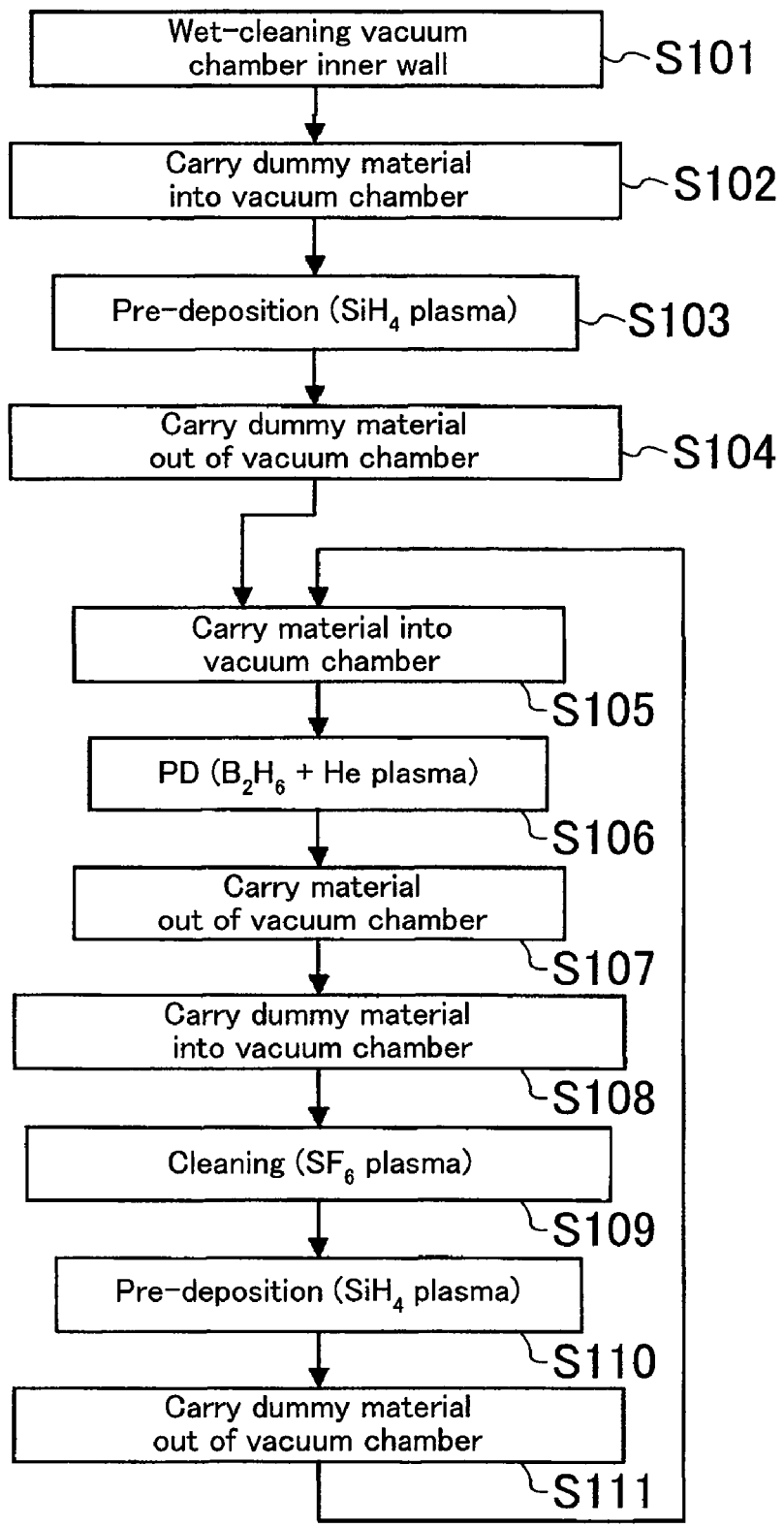
FIG. 3 is a flow chart showing the process procedure of the plasma doping method in one embodiment of the present invention.

FIG. 3 shows a typical process procedure of a plasma doping method of the present embodiment using the plasma doping apparatus shown in FIG. 1.

First, in step S101, the inner wall of the vacuum chamber 1 including the surface of the dielectric window 7 is subjected to wet-cleaning with water and an organic solvent, for example.

Then, in step S102, a silicon substrate as a dummy material is carried into the vacuum chamber 1 and placed on the sample stage 6.

Then, in step S103, a monosilane ($SiH_4$) gas and a hydrogen ($H_2$) gas, for example, are supplied at flow rates of 50 $cm^3$/min (standard state) and 100 $cm^3$/min (standard state), respectively, into the vacuum chamber 1 while exhausting the vacuum chamber 1, and a high-frequency power of 1500 W, for example, is supplied to the coil 8 while keeping the pressure inside the vacuum chamber 1 to 1.0 Pa, thereby producing a plasma in the vacuum chamber 1, and depositing a thin amorphous silicon film as a silicon-containing film on the inner wall of the vacuum chamber 1 including the surface of the dielectric window 7. Step S103 is a gas supplying step of introducing a plasma producing gas into the vacuum chamber 1 with no substrate 9 being placed in the vacuum chamber 1, prior to the plasma doping process to be described later. A deposit is often produced in this step, and the step can be considered a deposition process. Therefore, the step is hereinafter referred to as "pre-deposition". The amount of time for which a plasma is generated in step S103 (the pre-deposition time) was set to 10 seconds, for example. While the thickness of the thin amorphous silicon film deposited in step S103 varies from one position to another, it was about 50 nm near the center of the dielectric window 7 and was about 35 nm at a position of substantially the same height as the sample stage 6 on the inner side wall of the vacuum chamber 1. The $H_2$ gas supplied into the vacuum chamber 1 in step S103 produces an effect of terminating the dangling bond of the thin amorphous silicon film in the deposition process. Thus, it is possible to deposit a more dense thin amorphous silicon film.

Then, in step S104, the silicon substrate as a dummy material is carried out of the vacuum chamber 1. Then, in step S105, the silicon substrate 9 as a substrate is carried into the vacuum chamber 1 and placed on the sample stage 6. In the present embodiment, the dummy material or the substrate is carried into or out of the vacuum chamber 1 without exposing the vacuum chamber 1 to the atmosphere.

Then, in step S106, gases containing B (boron), for example, as an impurity, e.g., a $B_2H_6$ gas diluted to 1% by volume with He and an He gas, are supplied at flow rates of 5 $cm^3$/min (standard state) and 100 $cm^3$/min (standard state), respectively, into the vacuum chamber 1 while exhausting the vacuum chamber 1, and a high-frequency power of 1500 W, for example, is supplied to the coil 8 while keeping the pressure inside the vacuum chamber 1 at 0.8 Pa, thereby producing, inside the vacuum chamber 1, a plasma containing boron being an impurity. In this process, a high-frequency power of 140 W, for example, is supplied to the sample stage 6 for 50 seconds so that boron ions in the plasma impinge upon the surface of the silicon substrate 9 being a substrate, thereby introducing boron into a surface portion of the silicon substrate 9. In this process, a boron-containing film (thin boron film) deposits on the inner wall of the vacuum chamber 1 including the surface of the dielectric window 7. In FIG. 3, the plasma doping process is abbreviated as "PD".

Then, in step S107, the silicon substrate 9 as a substrate is carried out of the vacuum chamber 1. Then, in step S108, a silicon substrate as a dummy material is carried into the vacuum chamber 1 and placed on the sample stage 6.

Then, in step S109, an $SF_6$ gas, for example, as an F-containing gas is supplied at a flow rate of 200 $cm^3$/min (standard state) into the vacuum chamber 1 while exhausting the vacuum chamber 1, and a high-frequency power of 1500 W, for example, is supplied to the coil 8 while keeping the pressure inside the vacuum chamber 1 at 0.8 Pa, for example, thereby producing a plasma in the vacuum chamber 1 and removing the boron-containing film and the silicon-containing film deposited on the inner wall of the vacuum chamber 1 including the surface of the dielectric window 7. Step S109 is a process of removing the deposit on the inner wall of the vacuum chamber 1, and will hereinafter be referred to as "cleaning". The amount of time for which a plasma is generated in step S109 (the cleaning time) was set to 20 seconds, for example.

Then, in step S110, a monosilane ($SiH_4$) gas and a hydrogen ($H_2$) gas, for example, are supplied at flow rates of 50 $cm^3$/min (standard state) and 100 $cm^3$/min (standard state) into the vacuum chamber 1 while exhausting the vacuum chamber 1, and a high-frequency power of 1500 W, for example, is supplied to the coil 8 while keeping the pressure inside the vacuum chamber 1 at 1.0 Pa, for example, thereby producing a plasma in the vacuum chamber 1 for about 10 seconds, for example, and depositing a thin amorphous silicon film as a silicon-containing film on the inner wall of the vacuum chamber 1 including the surface of the dielectric window 7.

Then, in step S111, the silicon substrate as a dummy material is carried out of the vacuum chamber 1.

Then, the plasma doping process can be performed on many substrates by repeating step S105 of carrying in the substrate through step S111 of carrying out the dummy material as shown in FIG. 3. The substrate surface resistance (a quantity that has a correlation with the dose) was measured after performing an impurity-activating heat treatment on the processed substrate, indicating that the substrate surface resistance after the activation heat treatment was substantially constant over many substrates.

The reason why the reproducibility of the concentration of an impurity introduced into the substrate surface was improved over the conventional techniques by the plasma doping method of the present embodiment will now be described.

Figure 5:
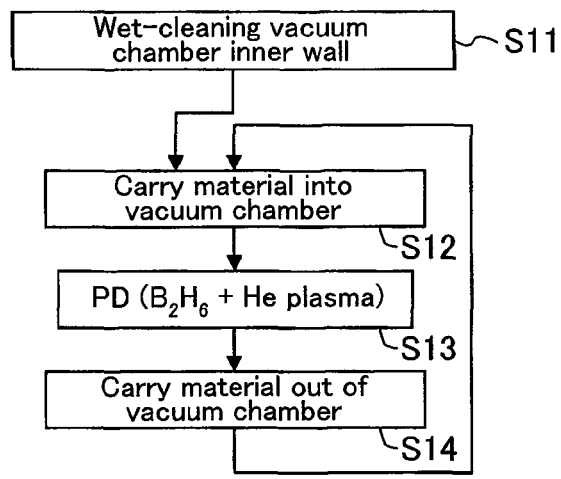
FIG. 5 is a flow chart showing the process procedure of a conventional plasma doping method.
Figure 6:
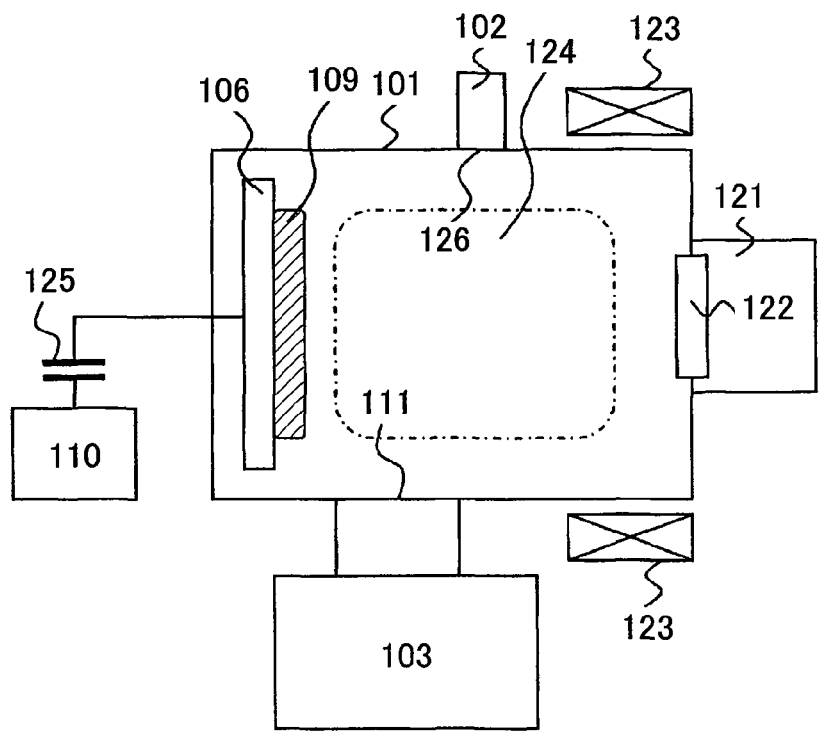
FIG. 6 is a cross-sectional view showing a configuration of a conventional plasma doping apparatus.

FIG. 5 shows a typical process procedure of a conventional plasma doping method using a conventional plasma process apparatus shown in FIG. 6. First, in step S11 of the conventional plasma doping method, the inner wall of the vacuum chamber 101 is cleaned. Then, in step S12, the substrate 109 is carried into the vacuum chamber 101 and placed on the sample stage 106. Then, in step S13, a $B_2H_6$ gas and an He gas is supplied into the vacuum chamber 101, and a plasma is produced in the vacuum chamber 101 by the interaction between the microwave radiated from the microwave guide 121 and the DC magnetic field formed by the electromagnet 123. In this process, a high-frequency power is supplied to the sample stage 106 so that boron ions in the plasma impinge upon the surface of the substrate 109, thereby introducing boron into a surface portion of the substrate 109. In this process, a boron-containing film (thin boron film) deposits on the inner wall of the vacuum chamber 101. Then, in step S14, the substrate 109 is carried out of the vacuum chamber 101. Then, the plasma doping process is performed on many substrates by repeating step S12 of carrying in the substrate through step S14 of carrying out the substrate as shown in FIG. 5.

However, with the conventional plasma doping method, the thickness of the boron-containing film deposited on the inner wall of the vacuum chamber 101 increases when steps S12 to S14 are repeated. It is believed that this phenomenon occurs due to the adsorption of the boron radicals (neutral particles) produced in the plasma onto the inner wall surface of the vacuum chamber 101 and the boron ions being accelerated by the potential difference between the plasma potential (generally about 10 to 40 V) and the potential of the inner wall of the vacuum chamber 101 (a floating potential of generally about 5 to 20 V in a case where the inner wall of the vacuum chamber 101 is formed by a dielectric as is normally the case) to impinge upon the inner wall surface of the vacuum chamber 101, i.e., due to a thermal energy or an ion bombardment energy. Moreover, it is believed that in a case where $B_2H_6$ is used as a doping material gas, as the thickness of the boron-containing film deposit increases, the probability for boron radicals to be adsorbed onto the inner wall surface of the vacuum chamber 101 decreases, thereby increasing the boron radical density in the plasma. Ions in the plasma are accelerated by the potential difference to impinge upon the boron-containing film deposited on the inner wall surface of the vacuum chamber 101, thus causing sputtering, through which the amount of particles including boron supplied into the plasma gradually increases. Therefore, over the course of the plasma doping process, the dose gradually increases, whereby the substrate surface resistance after the activation heat treatment gradually decreases.

In contrast, in the present embodiment, for all of the substrates, including the first substrate to be subjected to the plasma doping process immediately after the inner wall of the vacuum chamber 1 is cleaned, a plasma doping process is performed with a silicon-containing film (thin amorphous silicon film) having deposited on the inner wall of the vacuum chamber 1 through the pre-deposition process. Therefore, even if an impurity such as boron deposits on the inner wall of the vacuum chamber 1, the deposit on the inner wall of the vacuum chamber 1 can be covered with the silicon-containing film, whereby the probability for boron radicals to be adsorbed onto the inner wall surface of the vacuum chamber 1 is kept substantially constant. Moreover, particles including an impurity such as boron are hardly sputtered from the inner wall of the vacuum chamber 1. In other words, there is a very small amount of particles including boron to be supplied into the plasma due to sputtering occurring as ions in the plasma are accelerated by the potential difference between the plasma and the inner wall of the vacuum chamber 1 to impinge upon the inner wall surface of the vacuum chamber 1. Therefore, it is believed that the boron radicals density in the plasma is kept substantially constant, thus stabilizing the amount of impurity (dose) to be introduced into each substrate, whereby the substrate surface resistance after the activation heat treatment becomes substantially constant over different substrates.

In the present embodiment, the boron-containing film deposited on the inner wall of the vacuum chamber 1 during the plasma doping process and the silicon-containing film deposited on the inner wall of the vacuum chamber 1 during the pre-deposition process are removed by a cleaning process using an F-containing gas. The cleaning process is performed for the following reason. That is, the pre-deposition process of the present embodiment is effective to suppress variations in the probability for boron radicals to be adsorbed, which depend on the thickness of the boron-containing film (thin boron film) on the inner wall of the vacuum chamber 1, or variations in the amount of particles including boron supplied into the plasma, thereby keeping the dose constant. However, if the thickness of the silicon-containing film deposited in the pre-deposition process increases, particles may occur due to peeling-off of the film, and in some cases, only the silicon-containing film may peel off to thereby partially expose the boron-containing film (thin boron film), thus varying the boron concentration in the plasma. It is believed that the peeling-off of the film occurs as the silicon-containing film deposited in the pre-deposition process grows thicker to thereby accumulate the internal stress or the thermal stress in the film. Therefore, the accumulated thickness of the silicon-containing film needs to be smaller than a thickness at which the peeling-off may occur. Thus, it is effective to remove the silicon-containing film by some method before the peeling-off of the silicon-containing film occurs. In view of this, in the present embodiment, a thin film on the inner wall of the vacuum chamber 1 (a boron-containing film and/or a silicon-containing film) is removed within a short period of time by the cleaning process. However, in a case where there is little influence of the peeling-off of the thin film on the inner wall of the vacuum chamber 1, etc., the cleaning process may not be necessary.

In the present embodiment, the cleaning process is performed after successively performing the pre-deposition process and the plasma doping process. Alternatively, a cleaning process using an $SF_6$ gas, for example, may be performed, whereby it is possible to remove water and organic solvent molecules adsorbed onto the inner wall of the vacuum chamber 1 during wet-cleaning, thereby further stabilizing the dose. Thus, the plasma doping method of the present embodiment shown in FIG. 3 may perform wet-cleaning in step S101, carry a silicon substrate as a dummy material into the vacuum chamber 1 and plate the silicon substrate on the sample stage 6 in step S102, perform a cleaning process, and then perform a pre-deposition process of step S103.

In the present embodiment, in a case where a plasma doping process is performed on the substrate without performing the pre-deposition process of step S110 after performing the cleaning process of step S109, the plasma doping process is performed with very minute cleaning residue deposited on the inner wall of the vacuum chamber 1 being exposed, whereby particles may occur. In view of this, the present embodiment performs the pre-deposition process of step S110 to thereby cover the cleaning residue deposited on the inner wall of the vacuum chamber 1 in step S109 with a silicon-containing film. Thus, it is possible to suppress the desorption of the minute particles from the inner wall of the vacuum chamber 1, thus suppressing the particle generation.

The present embodiment has illustrated a case where a silicon substrate as a dummy material is placed on the sample stage 6 in a step of generating a plasma in the vacuum chamber 1 with no substrate placed on the sample stage 6 in the vacuum chamber 1 such as during the cleaning process or the pre-deposition process. This is effective in that it is possible to prevent the surface of the sample stage 6 from being damaged by the plasma or to prevent an unnecessary film from depositing on the surface. However, it may not be necessary to place a dummy material on the sample stage 6 in cases where problems are not caused by the damage to the surface of the sample stage 6 by the plasma or the deposition of an unnecessary film on the surface.

It is significant particularly with plasma doping that it is very important for ensuring a process reproducibility to control the state of the inner wall of the vacuum chamber. Specifically, there are cases where a cleaning process or a pre-deposition process is performed when process variations due to the deposition of various thin films on the inner wall of the vacuum chamber cause problems in dry etching or plasma CVD. However, the concentration by volume of the reactive gas (an etching gas or a deposition gas (a gas for deposition)) in the mixed gas to be introduced into the vacuum chamber is from about several % to several tens %, and the deposit film on the vacuum chamber inner wall has a relatively small influence on the gas concentration. In contrast, in plasma doping, the concentration by volume of the impurity material gas in the inert gas to be introduced into the vacuum chamber is 1% or less (0.1% or less where the dose needs to be controlled with a particularly high precision), and the deposit film on the vacuum chamber inner wall has a greater influence on the gas concentration. According to the present embodiment, however, the vacuum chamber inner wall is covered with a silicon-containing film before the plasma doping process, whereby it is possible to reduce the influence of the deposit film on the vacuum chamber inner wall on the gas concentration.

In the present embodiment, the concentration by volume of an impurity-containing gas (impurity material gas) in the inert gas to be introduced into the vacuum chamber 1 needs to be at least 0.001% or more. With a concentration smaller than this, there is needed a plasma doping process of a very long period of time for obtaining an intended dose. As is apparent from the description above, it is preferred in the present embodiment for further stabilizing the dose that the impurity-containing gas used in the plasma doping process is not introduced into the vacuum chamber 1 during the pre-deposition process.

The embodiment of the present invention set forth above illustrates only some of the variations with respect to the shape of the vacuum chamber 1, the configuration and arrangement of electrodes, etc., which can be realized by the application of the present invention. It is understood that the present invention can be applied to realize various variations other than those illustrated above.

In the present embodiment, particularly where the substrate is a semiconductor substrate of silicon, minute transistors can be produced by using arsenic, phosphorus, boron, or the like, as an impurity to be introduced into the substrate. Depending on the material of the substrate, it is effective to use aluminum, antimony, or the like, as an impurity to be introduced into the substrate.

In the present embodiment, by controlling the temperature of the inner wall of the vacuum chamber 1 or the sample stage 6, it is possible to more precisely control the probability for impurity radicals to be adsorbed onto the inner wall of the vacuum chamber 1 or the surface of the substrate, thereby further increasing the reproducibility of the dose, i.e., the impurity concentration. In order to improve the denseness of the thin film deposited during the pre-deposition process, it is preferred to control the temperature of the inner wall of the vacuum chamber 1 to be 80° C. or more. In order to easily ensure the sealedness of the vacuum chamber 1 while suppressing the thermal deformation of the vacuum chamber 1, it is preferred to control the temperature of the inner wall of the vacuum chamber 1 to be 200° C. or less.

While the present embodiment has illustrated a case where a mixed gas obtained by diluting $B_2H_6$ with He is used as the gas to be introduced into the vacuum chamber 1 during the doping process, the process can generally use a mixed gas obtained by diluting an impurity-containing gas with a rare gas. For example, the impurity-containing gas may be $B_xH_y$ (x and y are natural numbers), $P_xH_y$ (x and y are natural numbers), or the like. These gases are advantageous in that they only include H, which has little influence when mixed in the substrate as an impurity, in addition to B and P. Other than $B_2H_6$, the B-containing gas may be $BF_3$, $BCl_3$, $BBr_3$, or the like. The P-containing gas may be, for example, $PF_3$, $PF_5$, $PCl_3$, $PCl_5$, $POCl_3$, or the like. Other than He, the rare gas may be Ne, Ar, Kr, Xe, or the like. A rare gas such as He is advantageous in that it is possible to realize a plasma doping method with a desirable dose reproducibility by realizing both a precise dose control and a low sputtering property while suppressing the influence when gas constituent atoms are mixed in the substrate or, in other words, suppressing the introduction of an undesirable impurity into the substrate surface. Among all the rare gases, He is most appropriate. The reason is as follows. That is, since He has a smaller sputtering yield for the same energy as compared with other rare gases, He has a smaller rate of increase in the impurity concentration, e.g., the boron concentration, occurring through sputtering of the inner wall of the vacuum chamber 1. Therefore, in a case where the pre-deposition process is performed for each of a plurality of substrates as will be described later, it is possible to reduce the influence of the impurity-containing film, e.g., the boron-containing film, deposited between a pre-deposition process and the next pre-deposition process. Thus, by using a mixed gas obtained by diluting an impurity-containing gas with He, it is possible to make very small the change in the dose due to the film containing an impurity such as boron and formed on the inner wall of the vacuum chamber 1. Therefore, it is possible to more precisely control the distribution of the dose by controlling the distribution of the gas ejection from the gas supplying device 2, whereby it is possible to easily ensure the dose uniformity across the substrate surface. The next most preferred rare gas to He is Ne. Although Ne has a slightly higher sputtering rate than He, it is advantageous in that a discharge can easily occur at a low pressure.

In the cleaning process of the present embodiment, it is possible to detect the end point of the cleaning process by monitoring the change in the plasma emission intensity or the change in the high-frequency impedance in the vacuum chamber 1. Then, it is possible to prevent the inner wall of the vacuum chamber 1, or the like, from being damaged by the plasma, thereby realizing a more stable plasma doping process. The change in the plasma emission intensity can be monitored by, for example, using a spectroscope connected to the optical fiber 16. Alternatively, a combination of an optical filter and a photodiode may be used instead of a spectroscope. The change in the high-frequency impedance in the vacuum chamber 1 can be monitored, for example, by calculating the impedance by using a high-frequency sensor or by monitoring the matching point of the high-frequency matcher (the value of the variable reactance).

While the present embodiment has illustrated a case where the pre-deposition process time is 10 seconds, the pre-deposition process time may be the smallest amount of time with which it is possible to suppress the occurrence of particles while ensuring the dose stability, and it preferably is generally 3 seconds or more and 60 seconds or less. Moreover, the pre-deposition process time is preferably determined so that the thickness of the silicon-containing film deposited on the inner wall of the vacuum chamber 1 is 5 nm or more and 1000 nm or less. This is because the dose stability deteriorates when the pre-deposition process time is less than 5 nm and particles are likely to occur if the pre-deposition process time is greater than 1000 nm.

While the present embodiment has illustrated a case where the cleaning process time is 20 seconds, the cleaning process time may be the smallest amount of time with which the boron-containing film and the silicon-containing film deposited on the inner wall of the vacuum chamber 1 can be removed, and it preferably is generally the pre-deposition process time multiplied by a factor being one or more and three or less.

While the present embodiment has illustrated a case where the gas to be supplied into the vacuum chamber 1 during the pre-deposition process is $SiH_4$ and $H_2$, the present invention is not limited thereto, but a gas containing $Si_xH_y$ (x and y are natural numbers) such as $Si_2H_6$ (disilane) may be used for depositing a thin amorphous silicon film as the silicon-containing film. The thin film to be deposited on the inner wall of the vacuum chamber 1 during the pre-deposition process should not be such a film that contaminates the silicon substrate 9 as a substrate. In view of this, the thin film to be deposited on the inner wall of the vacuum chamber 1 during the pre-deposition process is preferably a silicon film or a silicon oxide film in a case where the substrate is the silicon substrate 9. Thus, what can be used as the material of the thin film to be deposited during the pre-deposition process is an element belonging to the same group in the periodic table as the primary element of the substrate or an oxide thereof. Therefore, in a case where the substrate is an Si substrate, the deposition gas to be used in the pre-deposition process should contain C, Si or Ge, or the like, being a group IV element. In a case where the substrate is a GaAs substrate, an AlGaAs substrate, a GaN substrate or a GaP substrate, the deposition gas to be used in the pre-deposition process should contain B, Al, Ga or In being a group III element or N, P or As, or the like, being a group V element. Specifically, in a case where the plasma doping process is performed by using a GaAs substrate, for example, as the substrate instead of a silicon substrate, it is necessary to deposit in the pre-deposition process a film that does not contain a dopant species for the GaAs substrate (an element that when introduced generates a carrier; e.g., carbon). As described above, in the present invention, it is important that a thin film containing an element belonging to the same group in the periodic table as the primary element of the substrate is formed on the inner wall of the vacuum chamber 1. Then, the element belonging to the same group contained in the coating (thin film) formed in the vacuum chamber 1 does not serve as an impurity that forms a donor level or an acceptor level with respect to the substrate, whereby it is possible to prevent the substrate from being contaminated with an impurity.

In a case where an inner chamber is provided in the vacuum chamber 1 so as to surround the sample stage 6 in the present embodiment, a thin film containing an element belonging to the same group in the periodic table as the primary element of the substrate may be formed on the inner wall of the inner chamber during the pre-deposition process.

In the present embodiment, when a thin film, i.e., a silicon oxide film, is deposited on the inner wall of the vacuum chamber 1 during the pre-deposition process, the gas supplied into the vacuum chamber 1 may contain $O_2$. For example, if the gas supplied into the vacuum chamber 1 during the pre-deposition process is $SiH_4$ and $O_2$, a high-purity silicon oxide film with desirable denseness can be deposited on the inner wall of the vacuum chamber 1. Thus, since it is possible to form a thin film of a chemically stable oxide, it is possible to suppress the sputtering of the thin film. Therefore, it is possible to relatively easily realize a plasma doping method with a more desirable reproducibility of the concentration of the impurity introduced into the substrate surface.

In the present embodiment, the gas to be supplied into the vacuum chamber 1 during the pre-deposition process may contain an organic silane such as TEOS. In such a case, by using a mixed gas of an organic silane and $O_2$, it is possible to deposit a high-purity silicon oxide film with desirable denseness on the inner wall of the vacuum chamber 1. Thus, since it is possible to form a thin film of a chemically stable oxide, it is possible to suppress the sputtering of the thin film. Therefore, it is possible to relatively easily realize a plasma doping method with a more desirable reproducibility of the concentration of the impurity introduced into the substrate surface.

While the present embodiment has illustrated a case where $SF_6$ is used as an F-containing gas in the cleaning process, the gas used in the cleaning process is preferably $S_xF_y$ or $C_xF_y$ (x and y are natural numbers). These gases are advantageous in that the rate at which a silicon-containing film or a boron-containing film is removed is high and that they are inexpensive.

Variation of Embodiment

In the present embodiment, the rate at which a thin boron-containing film (thin boron film) deposits on the vacuum chamber inner wall surface during the plasma doping process was a thickness of about 660 nm for a plasma generation time of 300 minutes, i.e., about 2.2 nm/min on average. The rate at which a silicon-containing film deposits during the pre-deposition process was about 100 to 1000 nm/min, being about the same as that in ordinary plasma CVD.

The present embodiment has illustrated a case where the cleaning process and the pre-deposition process are performed for every substrate or, in other words, a case where the cleaning process and the pre-deposition process are performed once for one iteration of the plasma doping process. Alternatively, in a variation of the present embodiment, the cleaning process and the pre-deposition process may be performed after performing the plasma doping process successively on several to several tens substrates.

Figure 4:
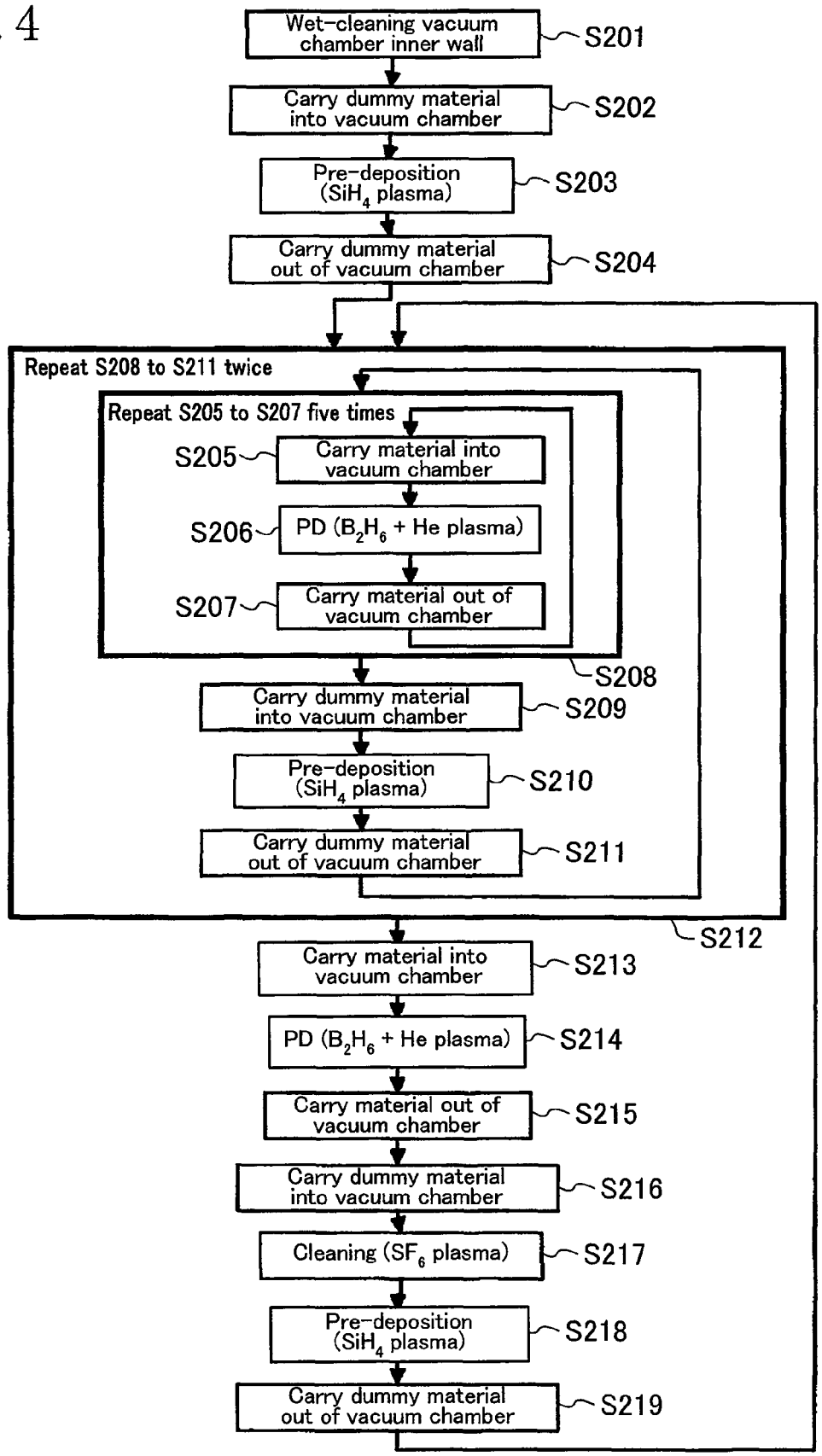
FIG. 4 is a flow chart showing the process procedure of the plasma doping method in one embodiment of the present invention.

FIG. 4 shows a process procedure of a plasma doping method according to a variation of the present embodiment using the plasma doping apparatus shown in FIG. 1. As an example, FIG. 4 shows a case where the pre-deposition process is performed for every five substrates and the cleaning process is performed for every 10 substrates. In the discussion of FIG. 4, like steps to those of the plasma doping method of the present embodiment shown in FIG. 3 will not be described repeatedly.

First, the process performs wet-cleaning on the inside of the vacuum chamber 1 in step S201, carries a dummy material into the vacuum chamber 1 in step S202, performs the pre-deposition process using a plasma of $SiH_4$, for example, in step S203, and then carries the dummy material out of the vacuum chamber 1 in step S204. Then, the process carries the silicon substrate 9 as a substrate into the vacuum chamber 1 in step S205, performs the plasma doping process by using a $B_2H_6$ gas diluted with He in step S206, and then carries the silicon substrate 9 as a substrate out of the vacuum chamber 1 in step S207. In the present variation, the process performs step S208 of repeating steps S205 to S207 for five substrate. Then, the process carries a dummy material into the vacuum chamber 1 in step S209, again performs the pre-deposition process in step S210, and then carries the dummy material out of the vacuum chamber 1 in step S211. In the present variation, the process performs step S212 of repeating steps S208 to S211 twice. Thus, in the present variation, the pre-deposition process is performed once for five iterations of the plasma doping process. Then, the process carries the silicon substrate 9 as a substrate into the vacuum chamber 1 in step S213, performs the plasma doping process by using a $B_2H_6$ gas diluted with He in step S214, and then carries the silicon substrate 9 as a substrate out of the vacuum chamber 1 in step S215. Then, the process carries a dummy material into the vacuum chamber 1 in step S216, and then performs the cleaning process using a plasma of an $SF_6$ gas, for example, in step S217. Then, the process performs the pre-deposition process in step S218, and then carries the dummy material out of the vacuum chamber 1 in step S219.

Then, steps S212 to S219 are repeated as shown in FIG. 4. Specifically, in the present variation, the cleaning process is performed once for 10 iterations of the plasma doping process.

According to the present variation, the cleaning process and the pre-deposition process are each performed once for a plurality of iterations of the plasma doping process on several to several tens substrate, whereby it is possible to perform a plasma doping process that realizes a high-precision impurity concentration control while reducing the process time, thus improving the productivity.

As in the present variation, the frequency of the pre-deposition process may be higher than that of the cleaning process.

For example, the cleaning process may be performed once for a plurality of iterations of the plasma doping process on several to several tens substrates, whereas the pre-deposition process is performed once for one iteration of the plasma doping process on one substrate. The frequency of each process may be determined taking the throughput into consideration. The particle generation can be prevented by setting the frequency of the cleaning process and that of the pre-deposition process so that the total thickness of the silicon-containing film cumulatively deposited in the pre-deposition process is 1000 nm or less, for example, at the time of performing the cleaning process.

Both in the present embodiment and in the present variation, it is preferred that the pressure inside the vacuum chamber 1 during the cleaning process and that during the pre-deposition process are 50% or more and 200% or less of that during the plasma doping process. Then, the area of plasma generation can be made substantially equal between the cleaning process, the pre-deposition process and the plasma doping process, whereby the area over which the boron-containing film is formed, the area over which the silicon-containing film is formed and the area of the cleaning process are substantially equal to one another. Therefore, it is possible to efficiently perform the processes.

Comparative Example

A conventional plasma doping described in Patent Document 5 (Japanese Laid-Open Patent Publication No. 6-61161) will now be described as a comparative example.

The present comparative example discloses adding an $SiH_4$ gas during the plasma doping process. This is for reducing or preventing the etching of the base semiconductor surface on which an impurity layer is to be formed, and serves to supplement silicon lost through sputtering during the plasma doping process. However, the present comparative example does not form a silicon-containing film on the vacuum chamber inner wall by using an $SiH_4$ gas before the plasma doping process as in the present embodiment. Therefore, the present comparative example does not at all realize the advantage of preventing the change in the impurity radical density in the plasma by covering a boron-containing film, or the like, that has deposited on the vacuum chamber inner wall by the end of the previous plasma doping process, i.e., the advantage of improving the reproducibility of the dose or the impurity concentration.

INDUSTRIAL APPLICABILITY

According to the present invention, it is possible to provide a plasma doping method and a plasma doping apparatus with a desirable reproducibility of the concentration of the impurity to be introduced into the substrate surface. Therefore, the present invention is applicable to a wide variety of technical fields, including the semiconductor impurity doping process and the production of thin film transistors for use in LCDs, etc.

The invention claimed is:
1. A plasma doping method, in which a substrate is placed in a vacuum chamber to form an impurity-doped layer therein, the method comprising:
   a step (a) of generating, in the vacuum chamber, a first plasma of a first gas containing an element belonging to the same group in the periodic table as a primary element of the substrate;

a step (b), after the step (a), of placing the substrate on a sample stage, which is provided in the vacuum chamber and functions as an electrode;

a step (c), after the step (b), of generating a second plasma of a second gas containing an impurity in the vacuum chamber and supplying a power to the sample stage as the electrode to thereby introduce the impurity into the substrate, thus forming the impurity-doped layer; and before the step (a), a step (d) of generating a third plasma of a third gas containing F (fluorine) in the vacuum chamber, wherein the step (d) is performed once for a plurality of iterations of the step (b) and the step (c).

2. The plasma doping method of claim 1, wherein in the step (a), a thin film containing the element belonging to the same group in the periodic table as the primary element of the substrate is deposited on an inner wall of the vacuum chamber.

3. The plasma doping method of claim 1, wherein the impurity is B (boron) or P (phosphorus).

4. The plasma doping method of claim 1, wherein in the step (a), a dummy material is placed on the sample stage.

5. The plasma doping method of claim 1, wherein the third gas contains $S_xF_y$ or $C_xF_y$ (x and y are natural numbers).

6. The plasma doping method of claim 1, wherein in the step (d), a substance deposited on an inner wall of the vacuum chamber is removed.

7. The plasma doping method of claim 1, wherein in the step (d), a dummy material is placed on the sample stage.

8. The plasma doping method of claim 1, wherein in the step (d), a change in a light emission intensity of the third plasma or a change in a high-frequency impedance in the vacuum chamber is monitored so as to detect an end point at which to end the step (d).

9. The plasma doping method of claim 1, wherein the step (a) is performed once for one iteration of the step (b) and the step (c).

10. The plasma doping method of claim 1, wherein the first gas contains $Si_xH_y$ (x and y are natural numbers).

11. The plasma doping method of claim 10, wherein the $Si_xH_y$ is $SiH_4$.

12. The plasma doping method of claim 10, wherein the first gas contains $H_2$.

13. The plasma doping method of claim 10, wherein the first gas contains $O_2$.

14. The plasma doping method of claim 1, wherein the first gas contains an organic silane.

15. The plasma doping method of claim 14, wherein the organic silane is TEOS.

16. The plasma doping method of claim 14, wherein the first gas contains $O_2$.

17. A plasma doping method, in which a substrate is placed in a vacuum chamber to form an impurity-doped layer therein, the method comprising:

a step (a) of generating, in the vacuum chamber, a first plasma of a first gas containing an element belonging to the same group in the periodic table as a primary element of the substrate;

a step (b), after the step (a), of placing the substrate on a sample stage, which is provided in the vacuum chamber and functions as an electrode;

a step (c), after the step (b), of generating a second plasma of a second gas containing an impurity in the vacuum chamber and supplying a power to the sample stage as the electrode to thereby introduce the impurity into the substrate, thus forming the impurity-doped layer; and before the step (a), a step (d) of generating a third plasma of a third gas containing F (fluorine) in the vacuum chamber, wherein the step (a) is performed less frequently than the step (b) and the step (c), and the step (d) is performed less frequently than the step (a).

18. The plasma doping method of claim 17, wherein in the step (a), a thin film containing the element belonging to the same group in the periodic table as the primary element of the substrate is deposited on an inner wall of the vacuum chamber.

19. The plasma doping method of claim 17, wherein the impurity is B (boron) or P (phosphorus).

20. The plasma doping method of claim 17, wherein in the step (a), a dummy material is placed on the sample stage.

21. The plasma doping method of claim 17, wherein the third gas contains $S_xF_y$ or $C_xF_y$ (x and y are natural numbers).

22. The plasma doping method of claim 17, wherein in the step (d), a substance deposited on an inner wall of the vacuum chamber is removed.

23. The plasma doping method of claim 17, wherein in the step (d), a dummy material is placed on the sample stage.

24. The plasma doping method of claim 17, wherein in the step (d), a change in a light emission intensity of the third plasma or a change in a high-frequency impedance in the vacuum chamber is monitored so as to detect an end point at which to end the step (d).

25. The plasma doping method of claim 17, wherein the step (a) is performed once for one iteration of the step (b) and the step (c).

26. The plasma doping method of claim 17, wherein the first gas contains $Si_xH_y$ (x and y are natural numbers).

27. The plasma doping method of claim 26, wherein the $Si_xH_y$ is $SiH_4$.

28. The plasma doping method of claim 26, wherein the first gas contains $H_2$.

29. The plasma doping method of claim 26, wherein the first gas contains $O_2$.

30. The plasma doping method of claim 17, wherein the first gas contains an organic silane.

31. The plasma doping method of claim 30, wherein the organic silane is TEOS.

32. The plasma doping method of claim 30, wherein the first gas contains $O_2$.

* * * * *